(12) United States Patent
Guim Bernat

(10) Patent No.: US 10,444,722 B2
(45) Date of Patent: Oct. 15, 2019

(54) TECHNIQUES TO DIRECT ACCESS REQUESTS TO STORAGE DEVICES

(71) Applicant: Intel Corporation, Santa Clara, CA (US)

(72) Inventor: Francesc Guim Bernat, Barcelona (ES)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/721,400

(22) Filed: Sep. 29, 2017

(65) Prior Publication Data

US 2019/0101880 A1    Apr. 4, 2019

(51) Int. Cl.
*G06F 12/00* (2006.01)
*G05B 19/045* (2006.01)
*G06F 12/0813* (2016.01)
*G11C 11/408* (2006.01)
*G06F 12/06* (2006.01)
*G06F 12/02* (2006.01)

(52) U.S. Cl.
CPC ....... *G05B 19/045* (2013.01); *G06F 12/0238* (2013.01); *G06F 12/0246* (2013.01); *G06F 12/0646* (2013.01); *G06F 12/0813* (2013.01); *G11C 11/4085* (2013.01)

(58) Field of Classification Search
CPC ............... G05B 19/045; G06F 12/0238; G06F 12/0246; G06F 12/0646; G06F 12/0813; G11C 11/4085
See application file for complete search history.

(56) References Cited

U.S. PATENT DOCUMENTS

| | | | | |
|---|---|---|---|---|
| 2012/0102266 | A1* | 4/2012 | Olsson | G06F 17/3028 711/103 |
| 2015/0254186 | A1* | 9/2015 | Sugimoto | G06F 3/061 711/103 |
| 2017/0357589 | A1* | 12/2017 | Izawa | G06F 3/06 |
| 2018/0046594 | A1* | 2/2018 | Worley | G06F 13/16 |
| 2018/0074717 | A1* | 3/2018 | Olarig | G06F 11/30 |

* cited by examiner

*Primary Examiner* — Shawn X Gu
(74) *Attorney, Agent, or Firm* — Compass IP Law PC

(57) ABSTRACT

Examples include techniques to direct access requests to storage or memory devices. Examples include receiving an access request to remotely access storage devices. The access request included in a fabric packet routed to a target host computing node coupled with the storage devices through a networking fabric. The access request directed to shared or dedicated storage devices based on whether the access request is characterized or define as a sequential stream or a random stream.

20 Claims, 10 Drawing Sheets

Stream Configuration Table 226

| Client Configuration | | | | Detector Configuration | |
|---|---|---|---|---|---|
| Client ID | Priority | Current Mem. BW Demand | Last Known Access Request | Stream Change Pattern | Time Threshold |
| 108 | High | 20 GB/s | T-5ms | RNDM to SEQ | 2ms |
| 108 | High | 20 GB/s | T-5ms | SEQ to RNDM | 20ms |
| 110 | Low | 5 GB/s | T-2ms | RNDM to SEQ | 20ms |
| 110 | Low | 5 GB/s | T-2ms | SEQ to RNDM | 2ms |
| 112 | Med | 10 GB/s | T-6ms | RNDM to SEQ | 10ms |
| 112 | Med | 10 GB/s | T-6ms | SEQ to RNDM | 10ms |

*FIG. 3*

Stream Mapping Table 228

| Client ID | Memory Range(s) | NVMe Device(s) | Stream Type |
|---|---|---|---|
| 108 | Range 410 | 109-1 | SEQ |
| 110 | Ranges 420, 430 | 109-n, 109-(n-1) | RNDM |
| 112 | Range 440 | 109-2 | SEQ |

*FIG. 4*

Format 500

| Client ID Field 510 | Stream Type Change Field 520 | Memory Range(s) Field 530 |

```
RECEIVE, AT A CONTROLLER, AN ACCESS REQUEST TO READ DATA FROM OR
WRITE DATA TO AT LEAST ONE STORAGE DEVICE OF A PLURALITY OF
STORAGE DEVICES COUPLED WITH A TARGET HOST COMPUTING NODE,
THE ACCESS REQUEST INCLUDED IN A FABRIC PACKET ROUTED FROM A
REQUESTING COMPUTING NODE THROUGH A NETWORKING FABRIC
COUPLED WITH THE TARGET HOST COMPUTING NODE
802
```

```
DETECT WHETHER THE ACCESS REQUEST HAS A SEQUENTIAL ACCESS
PATTERN TO STORAGE DEVICE MEMORY ADDRESSES AT THE AT LEAST ONE
STORAGE DEVICE OR A RANDOM ACCESS PATTERN TO STORAGE DEVICE
MEMORY ADDRESSES AT THE AT LEAST ONE STORAGE DEVICE
804
```

```
DETERMINE WHETHER TO CHARACTERIZE THE ACCESS REQUEST AS A
SEQUENTIAL STREAM OR A RANDOM STREAM BASED, AT LEAST IN PART, ON
THE DETECTED ACCESS PATTERN
806
```

```
DIRECT THE ACCESS REQUEST TO A DEDICATED STORAGE DEVICE FROM
AMONG THE PLURALITY OF STORAGE DEVICES IF THE ACCESS REQUEST IS
CHARACTERIZED AS A SEQUENTIAL STREAM OR TO ONE OR MORE SHARED
STORAGE DEVICES FROM AMONG THE PLURALITY OF STORAGE DEVICES IF
THE ACCESS REQUEST IS CHARACTERIZED AS A RANDOM STREAM
808
```

*FIG. 8*

Storage Medium 900

Computer Executable Instructions for 800

FIG. 9

TECHNIQUES TO DIRECT ACCESS REQUESTS TO STORAGE DEVICES

TECHNICAL FIELD

Examples described herein are generally related to remote access to memory devices by compute nodes coupled with a networking fabric.

BACKGROUND

Demands by individuals, researchers, and enterprises for increased compute performance and storage capacity of computing devices have resulted in various computing technologies developed to address those demands. For example, compute intensive applications, such as enterprise cloud-based applications (e.g., software as a service (SaaS) applications), data mining applications, data-driven modeling applications, scientific computation problem solving applications, etc., typically rely on complex, large-scale computing environments (e.g., high-performance computing (HPC) environments, cloud computing environments, etc.) to execute the compute intensive applications, as well as store voluminous amounts of data. Such large-scale computing environments can include tens of hundreds (e.g., enterprise systems) to tens of thousands (e.g., HPC systems) of computing nodes connected via high-speed interconnects (e.g., fabric interconnects in a unified fabric).

A sharper focus on resource provisioning, resource management and meeting quality of service (QoS) requirements associated with service level agreements (SLAs) for large-scale computing environments may lead to a closer look at how certain resources are used. An area of focus may be use of disaggregated memory or storage devices that may be remotely accessed by computing nodes. These disaggregated memory or storage devices may include non-volatile and/or volatile types of memory that may be accessed through a memory controller. In some examples, the memory controller and the disaggregated storage or memory devices may be arranged to operate according to one or more standards or specifications such as, but not limited to, the Non-Volatile Memory Express (NVMe) Base Specification, revision 1.3, published in May 2017 ("NVM Express base specification" or "NVMe base specification"). For these examples, memory devices capable of being accessed using NVMe base specification protocols may be referred to as "NVMe devices".

NVMe devices may be remotely accessed by computing nodes interconnected via one or more types of unified fabric that may be referred to as "networking fabrics" that may use one or more communication protocols to exchange information or data. These networking fabrics may be capable of using a common architecture that supports use of NVMe base specification storage protocols to remotely access NVMe devices. Example communication protocols used by these networking fabrics may include, but are not limited to, Fibre Channel, InfiniBand, Remote Direct Memory Access (RDMA) over Converged Ethernet (RoCE), Internet Wide Area RDMA Protocol (iWARP) or transmission control protocol (TCP) communication protocols. The common architecture used by these types of networking fabrics may be based on one or more standards or specifications such as, but not limited to, the NVM Express over Fabrics (NVMeoF) Specification, revision 1.0, published in June 2016 ("NVMeoF specification"). Memory controllers hosted by computing nodes coupled with networking fabrics arranged to operate according to the NVMeoF specification to allow for remote access to NVMe devices may be referred to as "NVMeoF controllers".

BRIEF DESCRIPTION OF THE DRAWINGS

FIG. 3 illustrates an example first table.
FIG. 4 illustrates an example second table.
FIG. 5 illustrates an example format.
FIG. 8 illustrates an example of a logic flow.
FIG. 9 illustrates an example of a storage medium.

DETAILED DESCRIPTION

In some examples, an area of focus for large-scale computing environments may be how remote access to disaggregated memory devices may be managed most effectively. These disaggregated memory devices may include NVMe devices that may be remotely accessible through an NVMeoF controller hosted by a network node coupled with multiple other computing nodes via a networking fabric using a common architecture defined by the NVMeoF specification. These remotely accessible NVMe devices may be capable of delivering a relatively high amount of memory bandwidth when read/write requests are directed to sequential NVMe device memory addresses. The relatively high amount of memory bandwidth may be measured in the amount of data that may be read from or written to remotely accessible NVMe devices when read/write requests are directed to a large block or cluster of sequential NVMe device memory addresses as compared to read/write requests to random or non-sequential NVMe device memory addresses.

In current implementations involving a common networking fabric architecture based, at least in part, on the NVMeoF specification, read/write requests from computing nodes may be generated to remotely access NVMe devices through an NVMeoF controller. The source or requester generating these read/write requests may be referred to as "client computing nodes" or "requesting computing nodes". For these current implementations, multiple client computing nodes may separately generate read/write requests directed to respective sequential NVMe device memory addresses to remotely access the NVMe devices through the NVMeoF controller. Although the separate read/write requests are sequential in nature, the multiple read/write requests may be merged into a single stream by the NVMeoF controller. This merging of the separate read/write requests may result in random read/writes to NVMe device memory addresses. Thus, the merged read/write requests may form a stream of read/write accesses to the NVMe device memory addresses that are random in nature. The random nature of the merged streams may negatively impact or reduce increased memory bandwidth benefits associated with the separate read/write requests to sequential NVMe device memory addresses.

Figure 1:
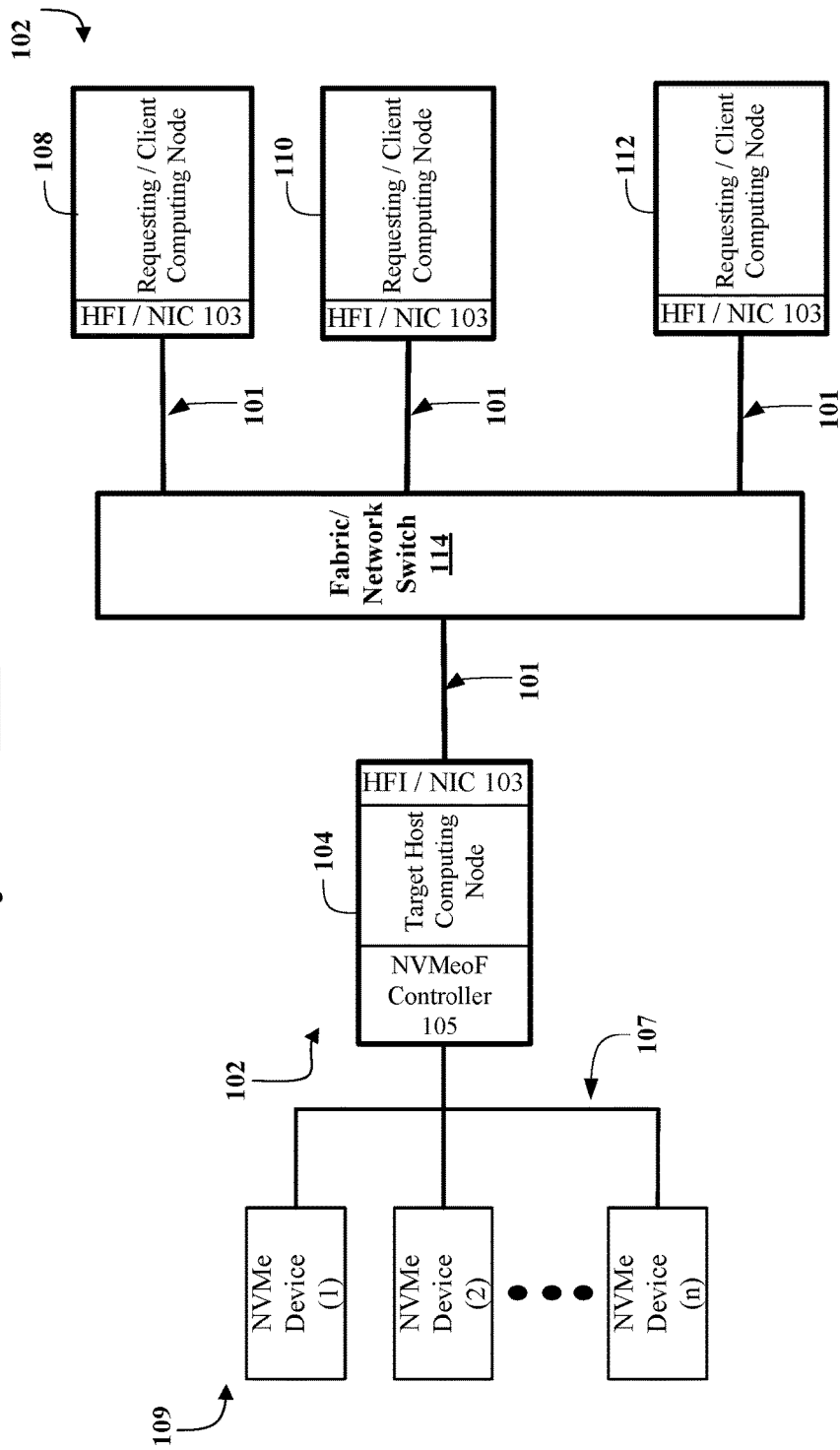
FIG. 1 illustrates an example system.

FIG. 1 illustrates an example system 100. In some examples, system 100 may represent at least a portion of a data center, a high performance computing (HPC) network, a telecommunications core network, an enterprise network or cloud-based distributed network. As shown in FIG. 1, computing nodes 102 may include a target host computing node 104 as well as multiple requesting/client computing nodes 108, 110 and 112. Computing nodes 102 may separately be communicatively coupled to a fabric/network switch 114 via individual fabric links 101. It should be appreciated that fabric/network switch 114 may be capable of receiving and forwarding network traffic (e.g., network packets, messages, datagrams, etc.) from computing nodes 102 coupled via fabric links 101. As described more below, each computing node 102 may include a host fabric interface (HFI)/network interface card (NIC) 103. HFI/NIC 103 may include communication circuitry and/or communication logic to enable computing nodes 102 to communicatively couple via fabric links 101 routed through fabric/network switch 114 and to facilitate receiving or transmitting of network traffic routed through fabric/network switch 114 and over fabric links 101.

In some examples, as shown in FIG. 1, target host computing node 104 may include an NVMeoF controller 105. As described more below, NVMeoF controller 105 may include logic and/or features capable of facilitating access to NVMe devices 109. NVMe devices 109 are shown in FIG. 1 as NVMe device (1) through NVMe device (n) that may be coupled via links 107. For these examples, the "nth" NVMe device of NVMe devices 109 may represent a positive integer and designates one or more additional NVMe devices 109. Also, links 107 may be configured to operate according to the NVMe base specification to access NVMe devices 109.

According to some examples, NVMe devices 109 may serve as disaggregated storage resources that may be remotely accessible to requesting/client computing nodes 108, 110 or 112. For these examples, this remote access may be facilitated by NVMeoF controller 105 that is configured to operate according to the NVMeoF specification. Also, fabric links 101, fabric/network switch 114 and HFI/NIC 103 included in computing nodes 102 may be configured to operate using various types of communication protocols including, but not limited to, Fibre Channel, InfiniBand, RoCE, iWARP or TCP communication protocols as well as operating according to the NVMeoF specification to remotely access NVMe devices 109 via fabric links 101.

In some examples, NVMeoF controller 105 may receive access requests to read or write data to NVMe devices 109. These access requests may have originated from requesting/client computing nodes 108, 110 or 112 and may have been routed to target host computing node 104 via fabric links 101 through fabric/network switch 114. As described more below, logic and/or features of NVMeoF controller 105 may be capable of detecting stream types associated with separate access requests submitted by respective requesting/client computing nodes 108, 110 or 112. Detected stream types may then be used as a way for the logic and/or features of NVMeoF controller 105 to cause a given access request to be directed to a single NVMe device 109 or cause the given access request to be directed to one or more NVMe devices 109 that may be shared.

According to some examples, NVMe devices 109 may include storage devices such solid state drives (SSDs) or other types of storage devices that may include non-volatile and/or volatile types of memory. Volatile types of memory may be memory whose state (and therefore the data stored on it) is indeterminate if power is interrupted. Non-volatile types of memory may refer to memory whose state is determinate even if power is interrupted. Dynamic volatile memory requires refreshing the data stored in this type of memory to maintain state. One example of dynamic volatile memory includes DRAM, or some variant such as synchronous DRAM (SDRAM). In addition to, or alternatively to, volatile types of memory included in NVMe device 109, non-volatile types of memory may be included in memory device(s) 109. According to some examples, non-volatile types of memory may include byte or block addressable types of non-volatile memory having a 3-dimensional (3-D) cross-point memory structure that includes chalcogenide phase change material (e.g., chalcogenide glass) hereinafter referred to as "3-D cross-point memory". Non-volatile types of memory may also include other types of byte or block addressable non-volatile memory such as, but not limited to, multi-threshold level NAND flash memory, NOR flash memory, single or multi-level phase change memory (PCM), resistive memory, nanowire memory, ferroelectric transistor random access memory (FeTRAM), anti-ferroelectric memory, resistive memory including the metal oxide base, the oxygen vacancy base and the conductive bridge Random Access Memory (CB-RAM), a spintronic magnetic junction memory, a magnetic tunneling junction (MTJ) memory, a Domain Wall (DW) and Spin Orbit Transfer (SOT) memory, a thiristor based memory, a magnetoresistive random access memory (MRAM) that incorporates memristor technology, spin transfer torque MRAM (STT-MRAM), or a combination of any of the above.

In some examples, computing nodes 102 may be embodied as any type of compute and/or storage device that is capable of performing the functions described herein, such as, without limitation, a server (e.g., stand-alone, rack-mounted, blade, etc.), a network appliance (e.g., physical or virtual), a web appliance, a distributed computing system, and/or a multiprocessor-based system.

It should be appreciated that, in other examples, there may be any number of computing nodes 102 (e.g., other target host computing nodes 104, other requesting/client computing nodes 108, 110, 112, etc.) coupled to fabric/network switch 114 or another fabric switch similar to fabric/network switch 114 in system 100. Accordingly, there may be multiple fabric/network switches in other examples. It should be further appreciated that, in such examples, multiple fabric/network switches may be connected, or daisy chained, to each other.

Figure 2:
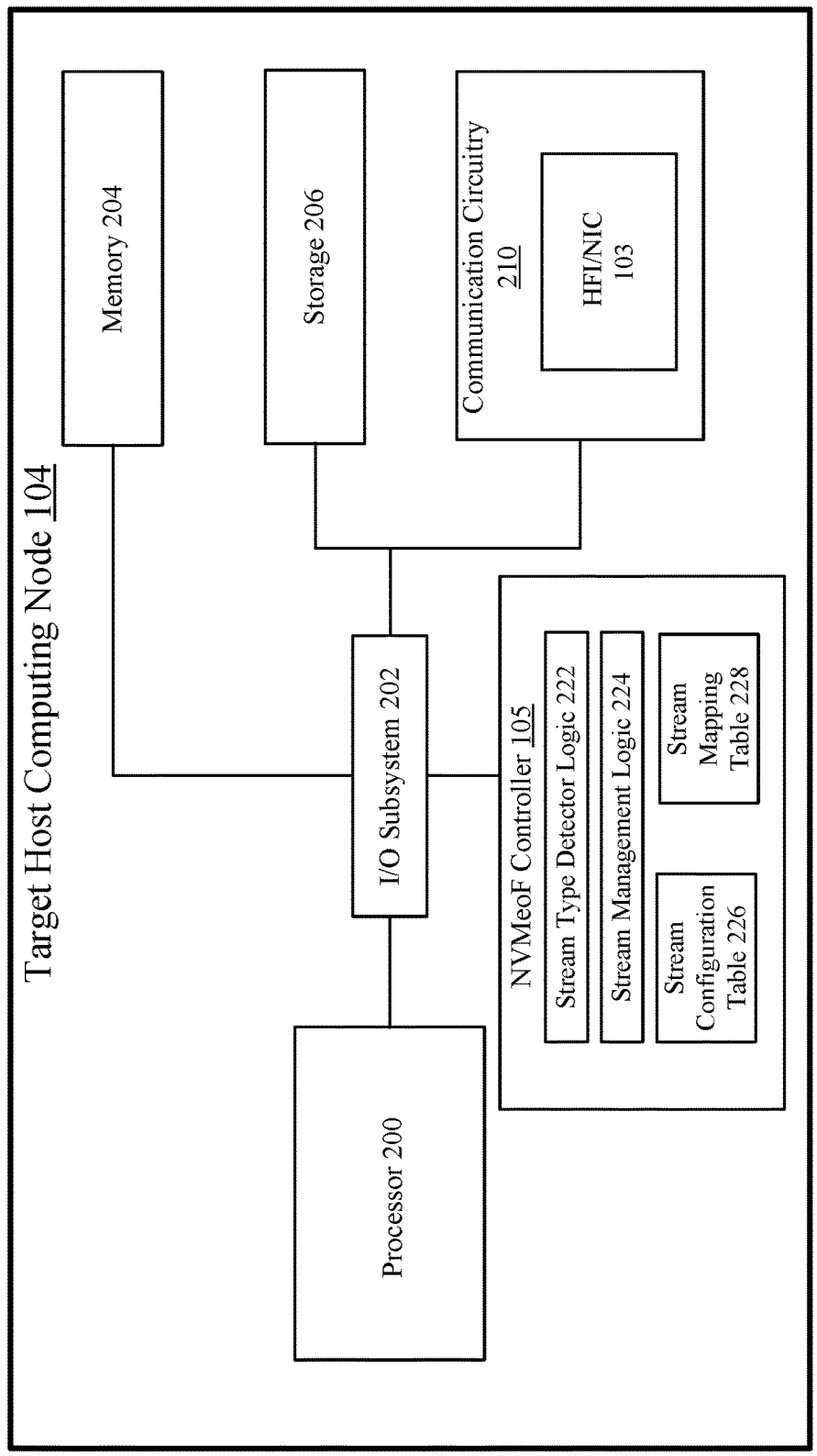
FIG. 2 illustrates an example target host computing node.

FIG. 2 illustrates an example block diagram of target host computing node 104. In some examples, as shown in FIG. 2, target host computing node 104 includes a processor 200, an input/output (I/O) subsystem 202, memory 204, storage 206, communication circuitry 210 and NVMeoF controller 105. One or more of the computing nodes 102 may include other or additional components, such as those commonly found in a computing device (e.g., peripheral devices, other processing/storage hardware, etc.), in other examples. Additionally, in some examples, one or more of the components shown in FIG. 2 may be incorporated in, or otherwise form a portion of, another component. For example, portions of memory 204 of target host computing node 104 may be incorporated in processor 200 (e.g., as cache memory). Further, in some examples, one or more of the illustrative components may be omitted from the target host computing node 104 or added to target host computing node 104. For example, although target host computing node 104 is shown as including a single processor 200, the target host computing node 104 may include a greater number of processors in other examples.

According to some examples, processor 200 may be embodied as any type of multi-core processor capable of performing the functions described herein, such as, but not limited to, a single physical multi-processor core chip, or package. In some examples, processor core(s) of processor 200 may be separately embodied as an independent logical execution unit capable of executing programmed instructions. These processing core(s) may include a portion of cache memory (e.g., an L1 cache) and functional units usable to independently execute programs or threads. In some examples, processor 200 may be connected to a physical connector, or socket, on a motherboard (not shown) of the target host computing node 104 that is configured to accept a single physical processor package (i.e., a multi-core physical integrated circuit).

In some examples, memory 204 may be embodied as any type of volatile or non-volatile memory or data storage device capable of performing the functions described herein. In operation, memory 204 may store various data and software used during operation of the target host computing node 104, such as operating systems, applications, programs, libraries, and drivers. Memory 204 may be communicatively coupled to processor 200 or NVMeoF controller 105 via I/O subsystem 202, which may be embodied as circuitry and/or components to facilitate input/output operations with processor 200, NVMeoF controller 105, memory 204, or other components of target host computing node 104. For example, I/O subsystem 202 may be embodied as, or otherwise include, memory controller hubs, input/output control hubs, firmware devices, communication links (i.e., point-to-point links, bus links, wires, cables, light guides, printed circuit board traces, etc.) and/or other components and subsystems to facilitate the input/output operations. In some examples, I/O subsystem 202 may form a portion of a SoC and may be incorporated, along with one or all of processor 200, memory 204, NVMeoF controller 105 and/or other components of target host computing node 104, on a single integrated circuit chip.

According to some examples, storage 206 may be composed of any type of storage device or devices configured for short-term or long-term storage of data such as, for example, memory devices and circuits, memory cards, hard disk drives, solid-state drives, or other types of storage devices. It should be appreciated that storage 206 and/or the memory 204 (e.g., the computer-readable storage media) may store various data as described herein, including operating systems, applications, programs, libraries, drivers, instructions, etc., capable of being executed by a processor (e.g., processor 200) of target host computing node 104.

In some examples, communication circuitry 210 may include any communication circuit, device, or collection thereof, capable of enabling wireless and/or wired communications between target host computing node 104 and other computing devices (e.g., a requesting/client computing node 104, network switch 114, etc.). Communication circuitry 210 may be configured to use one or more communication technologies associated with networking fabrics including, but not limited to, Fibre Channel, InfiniBand, RoCE, iWARP or TCP communication protocols. Communication circuitry 210 may also capable of using other types of communication technologies in addition to those associated with networking fabric communication protocols to enable wireless and/or wired communications between target host computing node 104 and other computing devices (e.g., Internet Protocol (IP), Ethernet, Bluetooth®, Wi-Fi®, WiMAX, LTE, 5G, etc.).

According to some examples, as shown in FIG. 2, communication circuitry 210 may include HFI/NIC 103. HFI/NIC 103 may be composed of one or more add-in-boards, daughter cards, NICs, controller chips, chipsets, or other devices that may be used by target host computing node 104. For example, HFI/NIC 103 may be integrated with processor 200, embodied as an expansion card coupled to I/O subsystem 202 over an expansion bus (e.g., PCI Express (PCIe)), part of an SoC, or included on a multichip package that may contain one or more processors besides processor 200. In some examples, functionality of HFI/NIC 103 may be integrated into one or more components of target host computing node 104 at the board level, socket level, chip level, and/or other levels. HFI/NIC 103 may include logic and/or features to facilitate exchanges of data/messages between components (e.g., NVMeoF controller 105) of target host computing node 104 and requesting/client computing nodes received or transmitted over fabric links of a fabric network in order for the requesting/client computing nodes to remotely access one or more NVMe devices coupled with target host computing node 104. For example, facilitating the exchange of data/messages received in one or more fabric packets from requesting/client computing nodes 108, 110 or 112 routed via fabric links 101 through fabric/network switch 114 to target host computing node 104 coupled with NVMe devices 109 as shown in FIG. 1 for system 100. The one or more fabric packets may be arranged or exchanged according to communication protocols including, but not limited to, Fibre Channel, InfiniBand, RoCE, iWARP or TCP communication protocols and/or according to the NVMeoF specification.

In some examples, as shown in FIG. 2 and also shown in FIG. 1, target host computing node 104 also includes NVMeoF controller 105. As mentioned briefly above for FIG. 1, NVMeoF controller 105 may include logic and/or features capable of facilitating access to NVMe devices 109. According to some examples, as shown in FIG. 2, the logic and/or features capable of facilitating access to NVMe devices 109 may include, but are not limited to, a stream type detector logic 222, a stream management logic 224, a stream configuration table 226 or a stream mapping table 228. According to some examples, NVMeoF controller 105 may receive access requests included in fabric packets or fabric messages received and/or processed by HFI/NIC 103 to read or write data to NVMe devices 109. For these examples, the access requests may have originated from requesting/client computing nodes 108, 110 or 112 and routed to target host computing node 104 via fabric links 101 through fabric/network switch 114. At least some of the access requests may be associated with random access patterns hereinafter referred to as "random streams". These random streams may read/write data from/to random NVMe device memory addresses at one or more NVMe devices of NVMe devices 109. At least some of the individual access request may be associated with sequential access patterns hereinafter referred to as "sequential streams". These sequential streams may read/write data from/to sequential NVMe device memory addresses at one or more NVMe devices of NVMe devices 109.

According to some examples, stream type detector logic 222 may be capable of processing or analyzing access requests received at NVMeoF controller 105 to detect/determine whether these access requests are to be characterized or defined as either a random stream or a sequential stream. Stream type detector logic 222 may then cause access requests characterized or defined as random streams to be mapped to shared NVMe devices and may cause access requests characterized or defined as sequential streams to be mapped to one or more dedicated NVMe devices, provided these one or more dedicated NVMe devices have adequate available memory bandwidth to efficiently handle sequential read/writes from/to the one or more dedicated NVMe devices. In other words, if no NVMe devices have adequate available memory bandwidth, these access requests characterized as sequential streams may be mapped to shared NVMe devices in a similar manner as access requests characterized as random streams. That way an NVMe device's storage resources are not wasted or overburdened by dedicating a particular sequential stream to the NVMe device when that NVMe device cannot deliver on possible efficiencies associated with sequential read/writes due to inadequate available memory bandwidth. As described more below, stream type detector logic 222 may populate stream mapping table 228 with information to indicate how access requests from individual requesting/client computing nodes are to be mapped to either shared or dedicated NVMe devices.

According to some examples, at least some features of stream type detector logic 222 may be implemented by programmable logic such as a field programmable gate array. For these examples, algorithms used by stream type detector logic 222 to detect stream types may be updated or reprogrammed to adapt detection methods.

In some examples, as described more below, stream configuration table 226 may include information to configure how stream type detector logic 222 is to characterize or define and map access requests. Also, as described more below, stream configuration table 226 may also include information to configure how access requests from each requesting/client computing node are to be handled.

According to some examples, stream management logic 224 may be capable of using stream mapping table 228 to redirect access requests from requesting/client computing nodes to either shared or dedicated NVMe devices. For example, if a first requesting/client computing node sends a first access request associated with random access patterns to NVMe memory addresses at a first NVMe devices, stream type detector logic 222 may have mapped this access request to shared NVMe devices and information in stream mapping table 228 may indicate this shared NVMe device mapping. Stream management logic 224 may then use stream mapping table 228 to redirect the access request to cause data to be read/write from/to addresses at the shared NVMe devices. Also, in other examples where access requests may have sequential access patterns, yet inadequate memory bandwidth at the targeted NVMe device to fully benefit from sequential read/write from/to the targeted NVMe device memory addresses, stream type detector logic 222 may have mapped these access requests from requesting/client computing nodes to shared NVMe devices. For these other examples, stream management logic 224 may then use stream mapping table 228 to redirect the access request having sequential access patterns to cause data to be read/write from/to addresses at the shared NVMe devices in the same manner as requests having random access patterns.

In some examples, NVMe devices 109 may be arranged to store replicated data. For example, NVMe device 109-1 may include replicated data of NVMe device 109-2. For these examples, when a requesting/client computing places an access request to read the replicated data, stream management logic 224 may also decide which device is to provide an access stream to read the data. Stream management logic 224 may determine which NVMe device to use based on a stream type as detected by stream type detector logic 222 as well as how stream types have been mapped to respective NVMe device 109-1 and 109-2. For an example where the access stream is a detected as a sequential stream, if NVMe device 109-1 is mapped as a shared NVMe device for random streams and NVMe device 109-2 is not yet dedicated to a stream, stream management logic 224 may decide that the replicated data is only read from the not yet dedicated NVMe device 109-2.

According to some examples, stream management logic 224 may include logic and/or features to notify requesting/client computing nodes when a given stream is redirected to either dedicated NVMe device(s) 109 or to shared NVMe device(s) 109. For these examples, a requesting/client computing node may provide virtual memory addresses for access requests and the redirected addresses included in stream mapping table 228 may reflect physical memory addresses at the dedicated or shared NVMe device(s). The logic and/or features of stream management logic 224 may be configured or arranged to translate received virtual memory addresses to the redirected physical memory addresses. A page table architecture may be utilized to map virtual addresses to physical addresses.

FIG. 3 illustrates an example stream configuration table 226. In some examples, as shown in FIG. 3, stream configuration table 226 includes client configuration information and detector configuration information. In some examples, stream configuration table 226 may be maintained in a data structure (e.g., a lookup table) stored in a memory maintained at NVMeoF controller 105 and accessible to stream type detector logic 222. As briefly mentioned above, stream type detector logic 222 may use information included in stream configuration table 226 to characterize and map access requests. As described in more detail below, stream type detector logic 222 may also use the information included in stream configuration table 226 to populate or update respective client entries in stream mapping table 228 for use by stream management logic 224 to handle access requests from each requesting/client computing.

In some examples, client configuration information may include a client identifier (ID) for each entry in stream configuration table 226 associated with access requests targeted to NVMe devices 109 coupled with target host computing node 104 and controlled by NVMeoF controller 105. For example, client IDs associated with requesting/client computing nodes 108, 110 and 112 are shown in FIG. 3. For simplicity purposes, requesting/client computing nodes 108, 110 and 112 are given numbers related to those shown in FIG. 1. Examples are not limited to 3-digit client IDs.

According to some examples, the client configuration information may also include an assigned priority for access requests to read/write from/to NVMe devices 109. The priority may be based, at least in part, on service level agreements (SLAs) or quality of service (QoS) requirements that may need to be met by clients when accessing NVMe devices 109. Client IDs having high priorities (e.g., 108) may have SLAs or QoS requirements that may require a relatively low latency for fulfilling access requests to NVMe devices 109. Meanwhile, client IDs having low priorities (e.g., 110) may have less restrictive SLAs or QoS requirements that may allow for a best effort or a relative high latency for fulfilling access request to NVMe devices 109. In some examples, client IDs having higher priorities (e.g., 108) may be selected for sequential stream accesses over client IDs having lower priorities (e.g., 110 or 112) if limited dedicated NVMe devices from among NVMe devices 109 are available for allocating to sequential streams.

In some examples, the client configuration information may also include current memory bandwidth (BW) demand for the client associated with a respective entry of stream configuration table 226. The current memory BW demand (e.g., in giga bytes per second (GB/s)) may be based on meeting SLA or QoS requirements or may be based on workload access patterns associated with a given client. Current memory BW demand may be relevant in examples where stream type detector logic 222 may want to map an access request from a client to one or more dedicated NVMe devices from among NVMe devices 109 and the access is characterized/defined as a sequential stream. If the current memory BW demand for the client is higher than available memory BW for any of NVMe devices 109 that may be available or capable of being dedicated to the access request characterized/defined as a sequential stream, stream type detector logic 222 may characterize/define the access request from this client as a random stream that is then mapped to shared NVMe devices from among NVMe devices 109. As mentioned previously, mapping an access request as a random stream to shared NVMe devices rather than mapping an access request as a sequential stream to dedicated NVMe devices may reduce inefficient use of storage resources.

According to some examples, the client configuration information may also include information for a last known access request to NVMe devices 109. In some examples, the last known access request may be based on a current time (T) minus an amount of time that has elapsed since an access request was last received by the client associated with a respective entry of stream configuration table 226.

In some examples, as shown in FIG. 3, stream configuration table 226 also includes detector configuration information. Detector configuration information may include information associated with how stream patterns may be changed from random streams to sequential streams or vice versa by stream type detector logic 222 when characterizing/defining and mapping access requests for respective client IDs. According to some examples, as shown in FIG. 3, detector configuration information may also include a time threshold that may indicate a period of time for which stream patterns may be changed from random to sequential or sequential to random. The time threshold may be relative to the last known access request. The time threshold may thus inhibit or prevent stream type detector logic 222 from changing access stream patterns if an access stream for a respective client ID has been changed within a given time threshold from the last known access request. For example, stream configuration table 226 has a last known access request of T−17 milliseconds (ms) for client ID 108. If the access stream pattern is to be changed from random to sequential, the threshold is 2 ms and the change would be allowed. However, if the access stream pattern is from sequential to random, the threshold is 20 ms and the change would be prevented.

FIG. 4 illustrates an example stream mapping table 228. In some examples, stream mapping table 228 includes information related to how access streams may be mapped to respective client IDs. As shown in FIG. 4, stream mapping table 228 includes information such a client ID, memory range(s), NVMe device(s) and stream type. As mentioned above, stream type detector logic 222 may populate or fill entries of stream mapping table 228 and stream management logic 224 may use the information to redirect access requests from requesting/client computing to nodes to either shared or dedicated NVMe devices. In some examples, stream mapping table 228 may be maintained in a data structure (e.g., a lookup table) stored in a memory maintained at NVMeoF controller 105 and accessible to stream type detector logic 222 and stream management logic 224.

According to some examples, memory range(s) entered by stream type detector logic 222 may correspond to memory address ranges at one or more NVMe devices from among NVMe devices 109. A range may be for sequential NVMe device memory addresses (e.g., physical memory addresses) at one or more dedicated NVMe devices if access request(s) from a respective client ID have been characterized/defined as a sequential stream. For example, range 410 may indicate sequential NVMe device memory addresses mapped to dedicated NVMe device 109-1 for client 108 and range 440 may indicate sequential NVMe device memory addresses mapped to dedicated NVMe device 109-2 for client 112. A range or ranges may be for random or NVMe device memory addresses at one or more shared NVMe devices if access request(s) from a respective client ID have been characterized/defined as a random stream. For example, range 420 and range 430 may indicate random NVMe device memory addresses mapped to shared NVMe devices 109-$n$ and 190-($n$−1) for client 110.

In some examples, stream management logic 224 may use stream mapping table 228 to redirect access requests from requesting/client computing nodes to either shared or dedicated NVMe devices. For example, if an access request is received from requesting/client computing node 110 that is directed to NVMe device 109-2, stream management logic 224 may use stream mapping table 228 to redirect the access request to ranges 420 and 430 at shared NVMe devices 109-$n$ and 109-($n$−1).

FIG. 5 illustrates an example format 500. In some examples, example format 500 may be example fields included in a fabric message or packet having an access request that was sent by a requesting/client computing node to a target host computing node to indicate or provide a hint to an NVMeoF controller at the target host computing node that an access stream is to change from a sequential stream to a random stream or vice versa. As shown in FIG. 5, example format 500 includes a client ID field 510, a stream type change field 520 and a memory range(s) field 530. Client ID field 510 may indicate the identifier for the requesting/client computing (e.g., 108). Stream type change field 520 may indicate whether the access stream is changing from a sequential stream to a random stream or vice versa. Memory range(s) field 530 may indicate one or more memory address ranges associated with the access stream.

According to some examples, a requesting/client computing node may include the fields of example format 500 in a fabric message or packet sent to a target host computing node responsive to an expected change in processing workloads or based on an unexpected change in processing workloads. The expected or unexpected changes may cause access patterns to change for accessing NVMe devices coupled with the target host computing node. For these examples, logic and/or features at an NVMeoF controller (e.g., stream type detector logic 222) may use the information included in the fields of example format 500 and information included in a stream configuration table (e.g., stream configuration table 226) to decide whether to update a stream mapping table (e.g., stream mapping table 228). The logic and/or features of the NVMeoF controller may then use the hint information conveyed in the fields of example format 500 to quickly adjust access patterns to NVMe devices coupled with the target host computing node and this may include directing subsequent access requests from the requesting/client computing node to either shared or dedicated NVMe devices.

Figure 6:
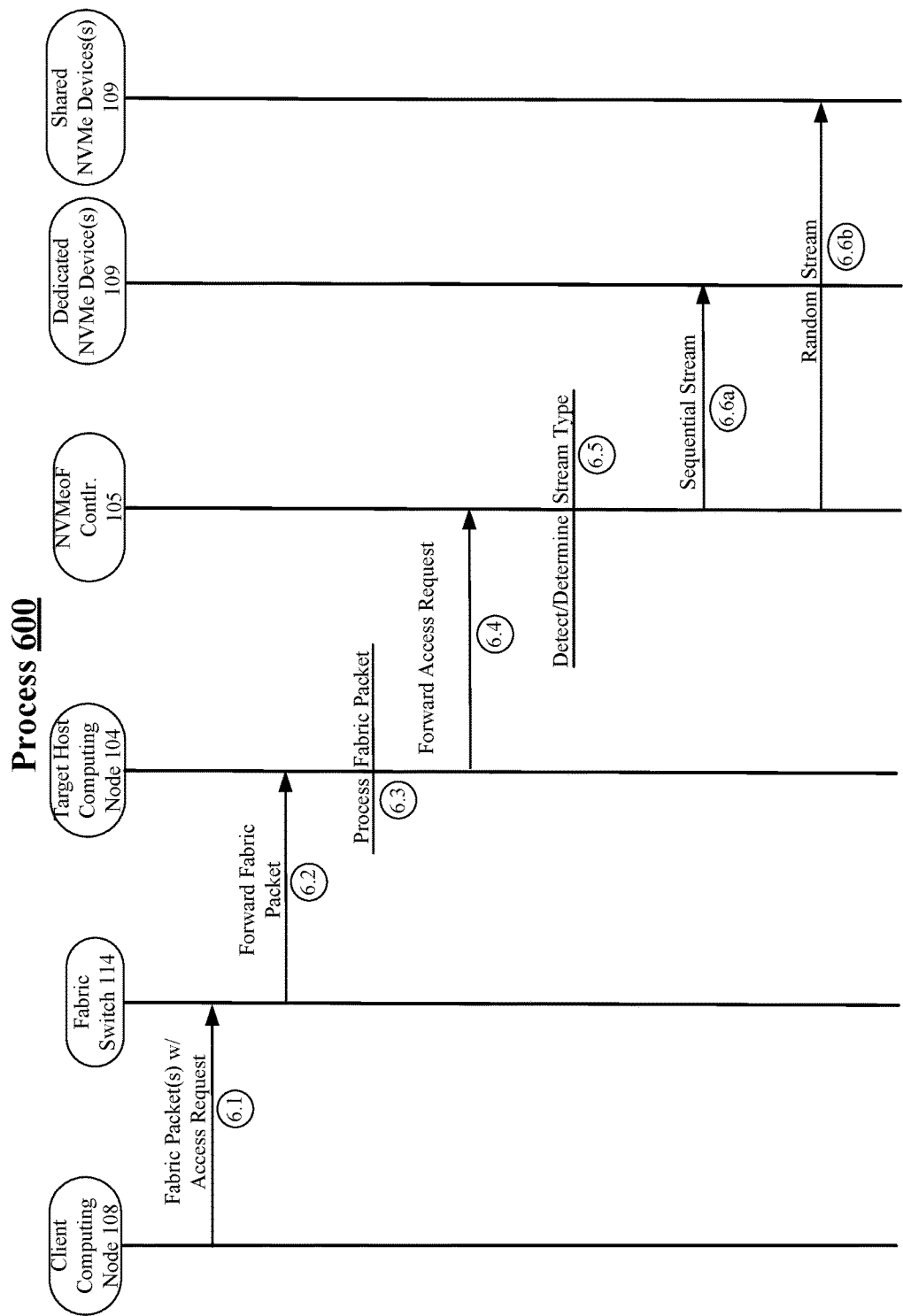
FIG. 6 illustrates an example process.

FIG. 6 illustrates an example process 600. According to some examples, process 600 may be an example of how logic and/or features of NVMeoF controller 105 may detect a stream type and cause access requests to be routed to dedicated or shared NVMe devices. For these examples, elements of system 100 as shown in FIG. 1 or elements of target host computing node 104 as shown in FIG. 2 may implement at least portions of process 600. Also, example stream configuration table 226 as shown in FIG. 3, example stream mapping table 228 as shown in FIG. 4 or example format 500 as shown in FIG. 5 may be used to implement at least portions of process 600. Examples are not limited to elements of system 100 or target host computing node 104 implementing process 600 or to use of stream configuration table 226, stream mapping table 228 or format 500 when implementing process 600.

Beginning at process 6.1 (Fabric Packet(s) w/Access Request), requesting/client computing node 108 may generate and send one or more fabric packets that may include an access request to read/write data to/from one or more NVMe devices coupled with target host computing node 104. In some examples, as shown in FIG. 6, the fabric packets may be routed through fabric/network switch 114. The one or more fabric packets may be arranged or exchanged according to communication protocols including, but not limited to, Fibre Channel, InfiniBand, RoCE, iWARP or TCP communication protocols and/or according to the NVMeoF specification.

Moving to process 6.2 (Forward Fabric Packet), fabric/network switch 114 may forward the fabric packet to target host computing node 104.

Moving to process 6.3 (Process Fabric Packet), logic and/or features at target host computing node 104 such as HFI/NIC 103 may process the fabric packet in order to de-encapsulate the access request from the fabric packet and identify that the access is to be forwarded to NVMeoF controller 105 that controls access to the one or more NVMe devices coupled with target host computing node 104.

Moving to process 6.4 (Forward Access Request), logic and/or features at target host computing node 104 may forward the identified access request to NVMeoF controller 105.

Moving to process 6.5 (Detect/Determine Stream Type), logic and/or features at NVMeoF controller 105 such as stream type detector logic 222 may detect and/or determine whether the access request is for a sequential stream or a random stream. In some examples, as shown in FIG. 4, stream mapping table 228 includes a mapping for access requests from client ID 108 to NVMe device 109-1. For this example, stream type detector logic 22 determines the access request as being characterized as a sequential stream based on stream mapping table 228. As a result of being determined as sequential stream, the process may then move to process 6.6a.

In some other examples, the access request may include a hint or information conveyed in the fabric message or packet received and processed by target host computing node 104 that the access request includes a change in access patterns from sequential to random. For these examples, stream type detector logic 222 may characterize or define the access request as being a random stream if the time threshold indicated in stream configuration table 226 has been exceeded. Stream type detector logic 222 may then update stream mapping table 228 to map access requests from client ID 108 to shared NVMe devices 109, the process may then move to process 6.6b. Examples, are not limited to hint information to recharacterize a stream. In alternative examples, stream type detector logic 222 may be able to quickly analyze the access request to detect if access patterns indicate sequential or random access patterns, determine whether to characterize/define the access request as a sequential or random stream and then update stream mapping table 228 based on how the access request was characterized.

Moving from process 6.5 to process 6.6a (Sequential Stream), logic and/or features at NVMeoF controller 105 such as stream management logic 224 may direct the access request to one or more dedicated NVMe device(s) 109. For example, stream management logic 224 may use stream mapping table 228 to direct the access request to range 410 at NVMe device 109-1. Process 600 may then come to an end for this sub-set of process 600.

Moving from process 6.5 to process 6.6b (Random Stream), logic and/or features at NVMeoF controller such as stream management logic 224 may direct the access request to one or more shared NVMe device(s) 109. In some examples, the one or more shared NVMe devices(s) 109 may be indicated in stream mapping table 228 as well as memory address ranges for which read/writes for random stream are to be addressed at these shared NVMe devices. Process 600 may then come to an end for this sub-set of process 600.

Figure 7:
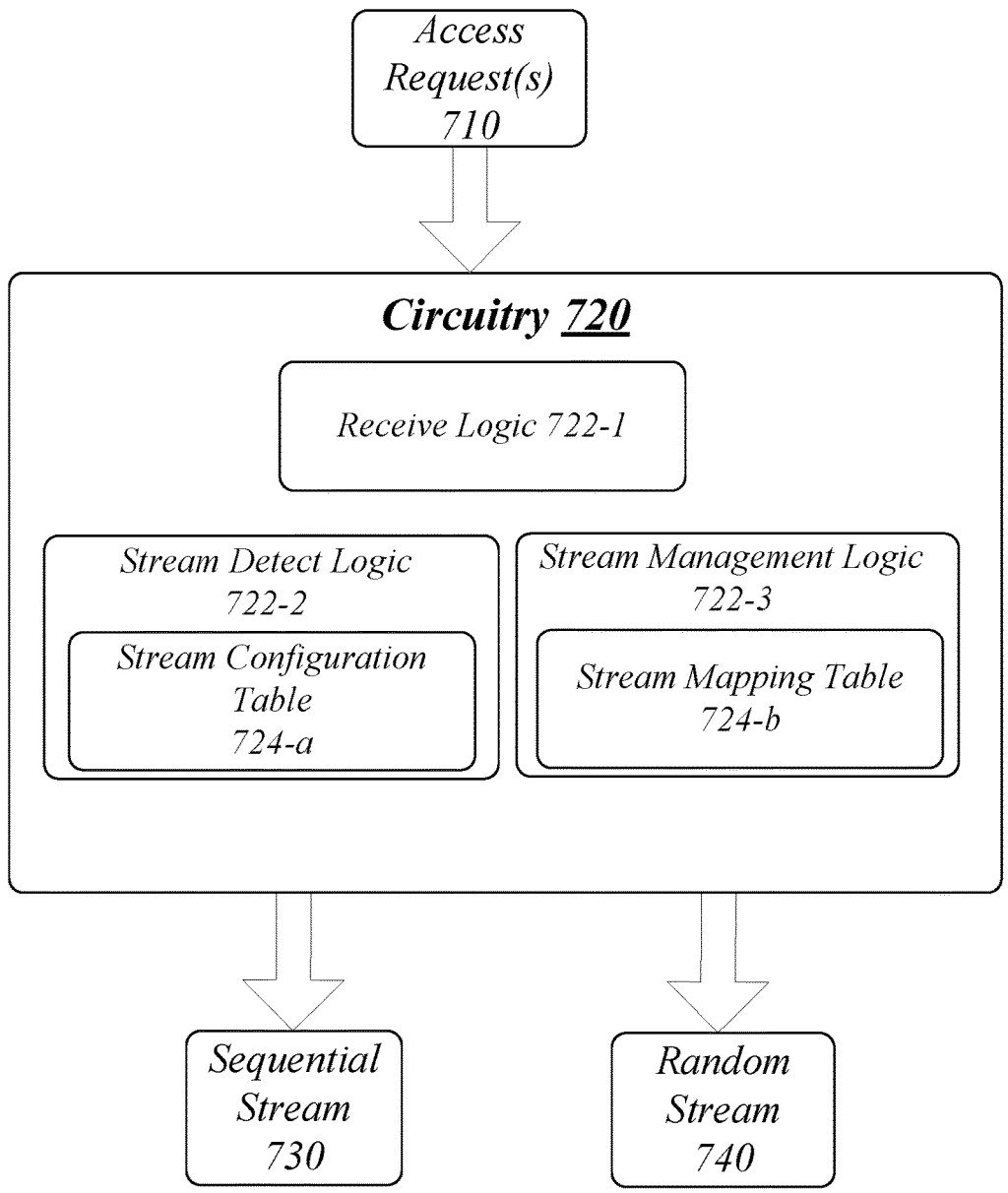
FIG. 7 illustrates an example block diagram for an apparatus.

FIG. 7 illustrates an example block diagram for an apparatus 700. Although apparatus 700 shown in FIG. 7 has a limited number of elements in a certain topology, it may be appreciated that the apparatus 700 may include more or less elements in alternate topologies as desired for a given implementation.

According to some examples, apparatus 700 may be associated with controller hosted by a target host computing node coupled with a networking fabric. For example, NVMeoF controller 105 as shown in FIG. 1 or 2. Apparatus 700 may be supported by circuitry 720. For these examples, circuitry 720 may be incorporated within a processor, central processing unit (CPU), application specific integrated circuit (ASIC) or may include one or more FPGAs maintained at a controller. Circuitry 720 may be arranged to execute one or more software, firmware or hardware implemented modules, components or logic 722-$a$ (module, component or logic may be used interchangeably in this context). It is worthy to note that "a" and "b" and "c" and similar designators as used herein are intended to be variables representing any positive integer. Thus, for example, if an implementation sets a value for a=3, then a complete set of any combination of software, firmware or hardware for logic 722-$a$ may include logic 722-1, 722-2 or 722-3. The examples presented are not limited in this context and the different variables used throughout may represent the same or different integer values. Also, "logic", "module" or "component" may also include software/firmware stored in computer-readable media, and although the types of logic are shown in FIG. 7 as discrete boxes, this does not limit these components to storage in distinct computer-readable media components (e.g., a separate memory, etc.).

According to some examples, circuitry 720 may include a processor, processor circuit or processor circuitry. Circuitry 720 may be generally arranged to execute or implement one or more modules, components or logic 722-$a$. Circuitry 720 may be all or at least a portion of any of various commercially available processors, including without limitation an AMD® Athlon®, Duron® and Opteron® processors; ARM® application, embedded and secure processors; IBM® and Motorola® DragonBall® and PowerPC® processors; IBM and Sony® Cell processors; Intel® Atom®, Celeron®, Core (2) Duo®, Core i3, Core i5, Core i7, Itanium®, Pentium®, Xeon®, Xeon Phi® and XScale® processors; and similar processors. According to some examples circuitry 720 may also include an ASIC and at least some logic 722-*a* may be implemented as hardware elements of the ASIC. According to some examples, circuitry 720 may also include an FPGA and at least some logic 722-*a* may be implemented as hardware elements of the FPGA.

According to some examples, apparatus 700 may include receive logic 722-1. Receive logic 722-1 may be executed or implemented by circuitry 720 to receive an access request to read data from or write data to at least one storage device of a plurality of storage devices coupled with a target host computing node that hosts the controller, the access request included in a fabric packet routed from a requesting computing node through a networking fabric coupled with the target host computing node. For these examples, the access request may be included in access request(s) 710. Access request(s) 710 may pulled/extracted from the fabric packet by a communication interface (e.g., a host fabric interface) for the target host computing node and forwarded for receipt by receive logic 722-1.

In some examples, apparatus 700 may include stream detect logic 722-2. Stream detect logic 722-2 may be executed or implemented by circuitry 720 to detect whether the access request has a sequential access pattern to storage device memory addresses at the at least one storage device or a random access pattern to storage device memory addresses at the at least one storage device. Stream detect logic 722-2 may then determine whether to characterize the access request as a sequential stream or a random stream based, at least in part, on the detected access pattern. For these examples, stream detect logic 722-2 may obtain or use information included in stream configuration table 724-*a* (e.g., maintained in a lookup table (LUT) to determine whether to characterize the access request as a sequential stream or a random stream.

According to some examples, apparatus 700 may include stream management logic 722-3. Stream management logic 722-3 may be executed or implemented by circuitry 720 to direct the access request to a dedicated storage device from among the plurality of storage devices if the access request is characterized as a sequential stream or to one or more shared storage devices from among the plurality of storage devices if the access request is characterized as a random stream. For these examples, stream management logic 722-3 may direct the access request based on information included in stream mapping table 724-*b*. Stream mapping table 724-*b* may be accessible (e.g., via a LUT) and may be generated or populated based on characterizations of access requests by stream detect logic 722-2. Sequential stream 730 may include the access request being directed to dedicated memory devices from among the plurality of storage devices and random stream 740 may include the access request being directed to one or more shared storage devices from among the plurality of storage devices.

Various components of apparatus 700 and an NVMeoF controller implementing apparatus 700 may be communicatively coupled to each other by various types of communications media to coordinate operations. The coordination may involve the unidirectional or bi-directional exchange of information. For instance, the components may communicate information in the form of signals communicated over the communications media. The information can be implemented as signals allocated to various signal lines. In such allocations, each message is a signal. Further embodiments, however, may alternatively employ data messages. Such data messages may be sent across various connections. Example connections include parallel interfaces, serial interfaces, and bus interfaces.

Included herein is a set of logic flows representative of example methodologies for performing novel aspects of the disclosed architecture. While, for purposes of simplicity of explanation, the one or more methodologies shown herein are shown and described as a series of acts, those skilled in the art will understand and appreciate that the methodologies are not limited by the order of acts. Some acts may, in accordance therewith, occur in a different order and/or concurrently with other acts from that shown and described herein. For example, those skilled in the art will understand and appreciate that a methodology could alternatively be represented as a series of interrelated states or events, such as in a state diagram. Moreover, not all acts illustrated in a methodology may be required for a novel implementation.

A logic flow may be implemented in software, firmware, and/or hardware. In software and firmware embodiments, a logic flow may be implemented by computer executable instructions stored on at least one non-transitory computer readable medium or machine readable medium, such as an optical, magnetic or semiconductor storage. The embodiments are not limited in this context.

FIG. 8 illustrates an example of a logic flow 800. Logic flow 800 may be representative of some or all of the operations executed by one or more logic, features, or devices described herein, such as apparatus 800. More particularly, logic flow 800 may be implemented by at least receive logic 722-1, stream detect logic 722-2 or stream management logic 722-3.

According to some examples, logic flow 800 at block 802 may receive, at a controller, an access request to read data from or write data to at least one storage device of a plurality of storage devices coupled with a target host computing node, the access request included in a fabric packet routed from a requesting computing node through a networking fabric coupled with the target host computing node. For these examples, receive logic 722-1 may receive the access request.

In some examples, logic flow 800 at block 804 may detect whether the access request has a sequential access pattern to storage device memory addresses at the at least one storage device or a random access pattern to storage device memory addresses at the at least one storage device. For these examples, stream detect logic 722-2 may detect the access pattern for the memory request.

According to some examples, logic flow 800 at block 806 may determine whether to characterize the access request as a sequential stream or a random stream based, at least in part, on the detected access pattern. For these examples, stream detect logic 722-2 may determine whether to character the access request as a sequential stream or a random stream.

In some examples, logic flow 800 at block 808 may direct the access request to a dedicated storage device from among the plurality of storage devices if the access request is characterized as a sequential stream or to one or more shared storage devices from among the plurality of storage devices if the access request is characterized as a random stream. For these examples, stream management logic 722-3 may direct the access request.

FIG. 9 illustrates an example of a storage medium 900. Storage medium 900 may comprise an article of manufacture. In some examples, storage medium 900 may include any non-transitory computer readable medium or machine readable medium, such as an optical, magnetic or semiconductor storage. Storage medium 900 may store various types of computer executable instructions, such as instructions to implement logic flow 800. Examples of a computer readable or machine readable storage medium may include any tangible media capable of storing electronic data, including volatile memory or non-volatile memory, removable or non-removable memory, erasable or non-erasable memory, writeable or re-writeable memory, and so forth. Examples of computer executable instructions may include any suitable type of code, such as source code, compiled code, interpreted code, executable code, static code, dynamic code, object-oriented code, visual code, and the like. The examples are not limited in this context.

Figure 10:
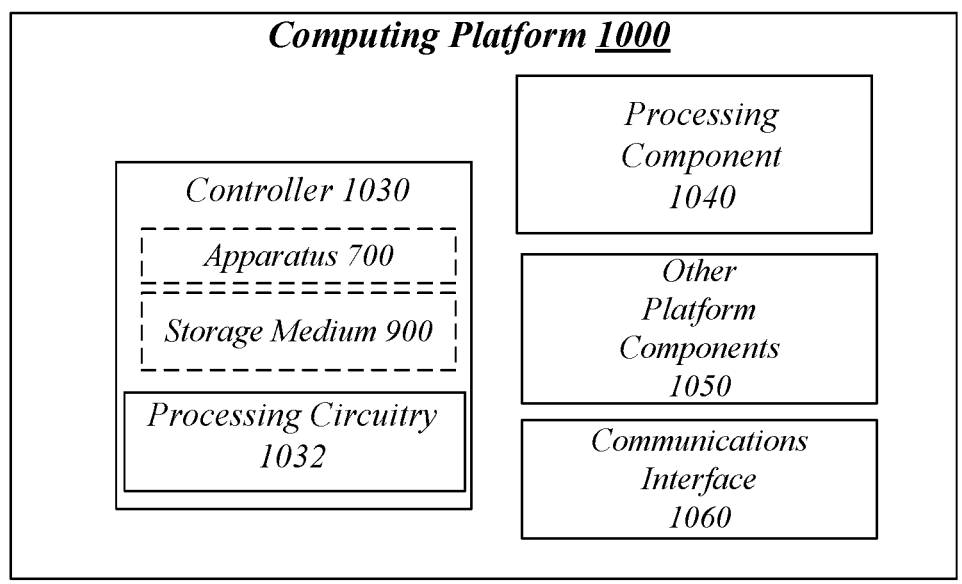
FIG. 10 illustrates an example computing platform.

FIG. 10 illustrates an example computing platform 1000. In some examples, as shown in FIG. 10, computing platform 1000 may include a controller 1030, a processing component 1040, other platform components 1050 or a communications interface 1060. According to some examples, computing platform 1000 may be implemented in a target host computing node coupled to a networking fabric such as target host computing node 104 shown in FIG. 1.

According to some examples, controller 1030 may be similar to NVMeoF controller 105 of system 100 as shown in FIG. 1. For these examples, logic and/or features resident at or located at controller 1030 may execute at least some processing operations or logic for apparatus 700 and may include storage media that includes storage medium 900. Controller 1030 may include processing circuitry 1032. Processing circuitry may include various hardware elements. Examples of hardware elements may include devices, logic devices, components, processors, microprocessors, circuits, processor circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), memory units, logic gates, registers, semiconductor device, chips, microchips, chip sets, and so forth.

According to some examples, processing component 1040 may include various hardware elements, software elements, or a combination of both. Examples of hardware elements may include devices, logic devices, components, processors, microprocessors, circuits, processor circuits, circuit elements (e.g., transistors, resistors, capacitors, inductors, and so forth), integrated circuits, ASIC, PLD, DSP, FPGA/programmable logic, memory units, logic gates, registers, semiconductor device, chips, microchips, chip sets, and so forth. Examples of software elements may include software components, programs, applications, computer programs, application programs, system programs, software development programs, machine programs, operating system software, middleware, firmware, software modules, routines, subroutines, functions, methods, procedures, software interfaces, APIs, instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given example.

In some examples, other platform components 1050 may include memory units, chipsets, controllers, peripherals, interfaces, oscillators, timing devices, video cards, audio cards, multimedia I/O components (e.g., digital displays), power supplies, and so forth. Examples of memory units associated with either other platform components 1050 or storage system 1030 may include without limitation, various types of computer readable and machine readable storage media in the form of one or more higher speed memory units, such as read-only memory (ROM), random-access memory (RAM), dynamic RAM (DRAM), Double-Data-Rate DRAM (DDRAM), synchronous DRAM (SDRAM), static RAM (SRAM), programmable ROM (PROM), erasable programmable ROM (EPROM), electrically erasable programmable ROM (EEPROM), flash memory, ferroelectric memory, SONOS memory, polymer memory such as ferroelectric polymer memory, FeTRAM or FeRAM, ovonic memory, single or multi-level PCM, nanowire, memristers, STT-MRAM, magnetic or optical cards, an array of devices such as Redundant Array of Independent Disks (RAID) drives, solid state memory devices, solid state drives (SSDs), hard disk drives (HDDs) or any other type of storage media suitable for storing information.

In some examples, communications interface 1060 may include logic and/or features to support a communication interface. For these examples, communications interface 1060 may include one or more communication interfaces that operate according to various communication protocols or standards to communicate over direct or network communication links. Direct communications may occur through a direct interface via use of communication protocols or standards described in one or more industry standards (including progenies and variants) such as those associated with the SMBus specification, the PCIe specification, the NVMe base specification, the SATA specification, SAS specification or the USB specification. Network communications may occur through a network interface via use of communication protocols or standards such as those described in one or more Ethernet standards promulgated by the IEEE. For example, one such Ethernet standard may include IEEE 802.3-2012, Carrier sense Multiple access with Collision Detection (CSMA/CD) Access Method and Physical Layer Specifications, Published in December 2012 (hereinafter "IEEE 802.3"). Network communication may also occur according to one or more OpenFlow specifications such as the OpenFlow Hardware Abstraction API Specification. Network communication may also occur over fabric links coupled with computing platform 1000 according to the NVMeoF specification, or using one or more of Fibre Channel communication protocols, InfiniBand communication protocols, RoCE communication protocols, iWARP communication protocols or TCP communication protocols.

As mentioned above computing platform 1000 may be implemented in a target host computing node coupled to a networking fabric. Accordingly, functions and/or specific configurations of computing platform 1200 described herein, may be included or omitted in various embodiments of computing platform 1200, as suitably desired for a computing node coupled to a networking fabric.

The components and features of computing platform 1000 may be implemented using any combination of discrete circuitry, ASICs, logic gates and/or single chip architectures. Further, the features of computing platform 1000 may be implemented using microcontrollers, programmable logic arrays and/or microprocessors or any combination of the foregoing where suitably appropriate. It is noted that hardware, firmware and/or software elements may be collectively or individually referred to herein as "logic", "circuit" or "circuitry."

One or more aspects of at least one example may be implemented by representative instructions stored on at least one machine-readable medium which represents various logic within the processor, which when read by a machine, computing device or system causes the machine, computing device or system to fabricate logic to perform the techniques described herein. Such representations may be stored on a tangible, machine readable medium and supplied to various customers or manufacturing facilities to load into the fabrication machines that actually make the logic or processor.

Various examples may be implemented using hardware elements, software elements, or a combination of both. In some examples, hardware elements may include devices, components, processors, microprocessors, circuits, circuit elements (e.g., transistors, resistors, capacitors, inductors, and so forth), integrated circuits, ASICs, PLDs, DSPs, FPGAs, memory units, logic gates, registers, semiconductor device, chips, microchips, chip sets, and so forth. In some examples, software elements may include software components, programs, applications, computer programs, application programs, system programs, machine programs, operating system software, middleware, firmware, software modules, routines, subroutines, functions, methods, procedures, software interfaces, APIs, instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given implementation.

Some examples may include an article of manufacture or at least one computer-readable medium. A computer-readable medium may include a non-transitory storage medium to store logic. In some examples, the non-transitory storage medium may include one or more types of computer-readable storage media capable of storing electronic data, including volatile memory or non-volatile memory, removable or non-removable memory, erasable or non-erasable memory, writeable or re-writeable memory, and so forth. In some examples, the logic may include various software elements, such as software components, programs, applications, computer programs, application programs, system programs, machine programs, operating system software, middleware, firmware, software modules, routines, subroutines, functions, methods, procedures, software interfaces, API, instruction sets, computing code, computer code, code segments, computer code segments, words, values, symbols, or any combination thereof.

According to some examples, a computer-readable medium may include a non-transitory storage medium to store or maintain instructions that when executed by a machine, computing device or system, cause the machine, computing device or system to perform methods and/or operations in accordance with the described examples. The instructions may include any suitable type of code, such as source code, compiled code, interpreted code, executable code, static code, dynamic code, and the like. The instructions may be implemented according to a predefined computer language, manner or syntax, for instructing a machine, computing device or system to perform a certain function. The instructions may be implemented using any suitable high-level, low-level, object-oriented, visual, compiled and/or interpreted programming language.

Some examples may be described using the expression "in one example" or "an example" along with their derivatives. These terms mean that a particular feature, structure, or characteristic described in connection with the example is included in at least one example. The appearances of the phrase "in one example" in various places in the specification are not necessarily all referring to the same example.

Some examples may be described using the expression "coupled" and "connected" along with their derivatives. These terms are not necessarily intended as synonyms for each other. For example, descriptions using the terms "connected" and/or "coupled" may indicate that two or more elements are in direct physical or electrical contact with each other. The term "coupled," however, may also mean that two or more elements are not in direct contact with each other, but yet still co-operate or interact with each other.

The follow examples pertain to additional examples of technologies disclosed herein.

Example 1

An example controller may include circuitry and logic for execution by the circuitry. The logic may receive an access request to read data to or write data from at least one storage device of a plurality of storage devices coupled with a target host computing node that hosts the controller, the access request included in a fabric packet routed from a requesting computing node through a networking fabric coupled with the target host computing node. The logic may also detect whether the access request has a sequential access pattern to storage device memory addresses at the at least one storage device or a random access pattern to storage device memory addresses at the at least one storage device. The logic may also characterize the access request as a sequential stream or a random stream based, at least in part, on the detected access pattern. The logic may also direct the access request to a dedicated storage device from among the plurality of storage devices if the access request is characterized as a sequential stream or to one or more shared storage devices from among the plurality of storage devices if the access request is characterized as a random stream.

Example 2

The controller of example 1, the logic may also obtain configuration information that includes a time threshold for a period of time between when a previous access request was received from the requesting computing node and when the access request was received. The previous access request previously characterized as a random stream. The logic may also characterize the access request as a sequential stream if the period of time exceeds the time threshold.

Example 3

The controller of example 1, the logic may also obtain configuration information that includes a memory bandwidth demand for the requesting computing node. The logic may also characterize the access request as a sequential stream if the dedicated storage device has enough available memory bandwidth to fulfill the memory bandwidth demand.

Example 4

The controller of example 1, the logic may also characterize the access request as a sequential stream. The logic may also obtain configuration information that includes a memory bandwidth demand for the requesting computing node. The logic may also map access requests from the requesting computing node to the dedicated storage device based, at least in part, on the dedicated storage device having enough available memory bandwidth to fulfill the memory bandwidth demand.

Example 5

The controller of example 4, the configuration information may also include an identifier for the requesting computing node. For these examples, the logic may use the identifier to map the access requests to the dedicated storage device. The logic may also receive a second access request from the requesting computing node that includes the identifier. The logic may also characterize the second access request as a sequential stream based on the identifier. The logic may also direct the second access request to the dedicated storage device based on the mapping of the access request to the dedicated storage device.

Example 6

The controller of example 4, the configuration information may also include an identifier for the requesting computing node. For these examples, the logic may use the identifier to map access requests from the requesting computing node to the dedicated storage device. The logic may also receive a second access request included in a second fabric packet from the requesting computing node that includes the identifier and information indicating a change in access patterns from sequential to random access patterns for the second access request. The logic may also characterize the second access request as a random stream based, at least in part, on the identifier and the indication of the change in access patterns. The logic may also direct the second access request to the one or more shared storage devices.

Example 7

The controller of example 6, the logic may also map subsequent access requests from the requesting computing node to the one or more shared storage devices.

Example 8

The controller of example 1, the logic to detect whether the access request has a sequential or a random access pattern may include use of an FPGA to detect the detected access pattern.

Example 9

The controller of example 1, may include the plurality of storage devices arranged to operate according to one or more NVMe Base Specifications including the NVMe Base Specification, revision 1.3.

Example 10

The controller of example 8, may include the controller arranged to operate according to the one or more NVMe Base Specifications including the NVMe Base Specification, revision 1.3 and according to one or more NVMeoF Specifications including the NVMeoF Specification, revision 1.0.

Example 11

The controller of example 10, may include the access request included in the fabric packet is arranged according to the one or more NVMeoF Specifications including the NVMeoF Specification, revision 1.0.

Example 12

The controller of example 11, may include the networking fabric arranged to operate using Fibre Channel communication protocols, InfiniBand communication protocols, RoCE communication protocols, iWARP communication protocols or TCP communication protocols.

Example 13

The controller of example 1 may include one or more of a command bus coupled to the circuitry, one or more processors coupled to the command bus and a host fabric interface communicatively coupled to the circuitry.

Example 14

An example method may include receiving, at a controller, an access request to read data to or write data from at least one storage device of a plurality of storage devices coupled with a target host computing node. The access request may be included in a fabric packet routed from a requesting computing node through a networking fabric coupled with the target host computing node. The method may also include detecting whether the access request has a sequential access pattern to storage device memory addresses at the at least one storage device or a random access pattern to storage device memory addresses at the at least one storage device. The method may also include determining whether to characterize the access request as a sequential stream or a random stream based, at least in part, on the detected access pattern. The method may also include directing the access request to a dedicated storage device from among the plurality of storage devices if the access request is characterized as a sequential stream or to one or more shared storage devices from among the plurality of storage devices if the access request is characterized as a random stream.

Example 15

The method of example 14 may include obtaining configuration information that includes a time threshold for a period of time between when a previous access request was received from the requesting computing node and when the access request was received. The previous access request may have been previously characterized as a random stream. The method may also include determining to characterize the access request as a sequential stream if the period of time exceeds the time threshold.

Example 16

The method of example 14 may include obtaining configuration information that includes a memory bandwidth demand for the requesting computing node. The method may also include determining to characterize the access request as a sequential stream if the dedicated storage device has enough available memory bandwidth to fulfill the memory bandwidth demand.

Example 17

The method of example 14 may include determining to characterize the access request as a sequential stream. The method may also include obtaining configuration information that includes a memory bandwidth demand for the requesting computing node. The method may also include mapping access requests from the requesting computing node to the dedicated storage device based, at least in part, on the dedicated storage device having enough available memory bandwidth to fulfill the memory bandwidth demand.

Example 18

The method of example 17, the configuration information may also include an identifier for the requesting computing node. The method may also include using the identifier to map the access requests to the dedicated storage device. The method may also include receiving a second access request from the requesting computing node that includes the identifier. The method may also include determining to characterize the second access request as a sequential stream based on the identifier. The method may also include directing the second access request to the dedicated storage device based on the mapping of the access request to the dedicated storage device.

Example 19

The method of example 17, the configuration information may also include an identifier for the requesting computing node. The method may also include using the identifier to map access requests from the requesting computing node to the dedicated storage device. The method may also include receiving a second access request included in a second fabric packet from the requesting computing node that includes the identifier and information indicating a change in access patterns from sequential to random access patterns for the second access request. The method may also include determining to characterize the second access request as a random stream based, at least in part, on the identifier and the indication of the change in access patterns. The method may also include directing the second access request to the one or more shared storage devices.

Example 20

The method of example 19 may also include mapping subsequent access requests from the requesting computing node to the one or more shared storage devices.

Example 21

The method of example 14, the plurality of storage devices may be arranged to operate according to one or more NVMe Base Specifications including the NVMe Base Specification, revision 1.3.

Example 22

The method of claim 21, the controller may be arranged to operate according to the one or more NVMe Base Specifications including the NVMe Base Specification, revision 1.3 and according to one or more NVMeoF Specifications including the NVMeoF Specification, revision 1.0.

Example 23

The method of example 22, the access request included in the fabric packet may be arranged according to the one or more NVMeoF Specifications including the NVMeoF Specification, revision 1.0.

Example 24

The method of example 23, the networking fabric may be arranged to operate using Fibre Channel communication protocols, InfiniBand communication protocols, RoCE communication protocols, iWARP communication protocols or TCP communication protocols.

Example 25

An example at least one machine readable medium may include a plurality of instructions that in response to being executed by a system may cause the system to carry out a method according to any one of examples 14 to 24.

Example 26

An example apparatus may include means for performing the methods of any one of examples 14 to 24.

Example 27

An example at least one machine readable medium may include a plurality of instructions that in response to being executed by a controller may cause the controller to receive an access request to read data to or write data from at least one storage device of a plurality of storage devices coupled with a target host computing node that hosts the controller. The access request may be included in a fabric packet routed from a requesting computing node through a networking fabric coupled with the target host computing node. The instructions may also cause the controller to detect whether the access request has a sequential access pattern to storage device memory addresses at the at least one storage device or a random access pattern to storage device memory addresses at the at least one storage device. The instructions may also cause the controller to characterize the access request as a sequential stream or a random stream based, at least in part, on the detected access pattern. The instructions may also cause the controller to direct the access request to a dedicated storage device from among the plurality of storage devices if the access request is characterized as a sequential stream or to one or more shared storage devices from among the plurality of storage devices if the access request is characterized as a random stream.

Example 28

The at least one machine readable medium of example 27, the instructions may also cause the controller to obtain configuration information that includes a time threshold for a period of time between when a previous access request was received from the requesting computing node and when the access request was received, the previous access request previously characterized as a random stream. The instructions may also cause the controller to characterize the access request as a sequential stream if the period of time exceeds the time threshold.

Example 29

The at least one machine readable medium of example 27, the instructions may also cause the controller to obtain configuration information that includes a memory bandwidth demand for the requesting computing node. The instructions may also cause the controller to characterize the access request as a sequential stream if the dedicated storage device has enough available memory bandwidth to fulfill the memory bandwidth demand.

Example 30

The at least one machine readable medium of example 27, the instructions may also cause the controller to characterize the access request as a sequential stream. The instructions may also cause the controller to obtain configuration information that includes a memory bandwidth demand for the requesting computing node. The instructions may also cause the controller to map access requests from the requesting computing node to the dedicated storage device based, at least in part, on the dedicated storage device having enough available memory bandwidth to fulfill the memory bandwidth demand.

Example 31

The at least one machine readable medium of example 30, the configuration information may also include an identifier for the requesting computing node. For these examples, the instructions may also cause the controller to use the identifier to map the access requests to the dedicated storage device. The instructions may also cause the controller to receive a second access request from the requesting computing node that includes the identifier. The instructions may also cause the controller to characterize the second access request as a sequential stream based on the identifier. The instructions may also cause the controller to direct the second access request to the dedicated storage device based on the mapping of the access request to the dedicated storage device.

Example 32

The at least one machine readable medium of example 30, the configuration information may also include an identifier for the requesting computing node. For these examples, the instructions may also cause the controller to use the identifier to map access requests from the requesting computing node to the dedicated storage device. The instructions may also cause the controller to receive a second access request included in a second fabric packet from the requesting computing node that includes the identifier and information indicating a change in access patterns from sequential to random access patterns for the second access request. The instructions may also cause the controller to characterize the second access request as a random stream based, at least in part, on the identifier and the indication of the change in access patterns. The instructions may also cause the controller to direct the second access request to the one or more shared storage devices.

Example 33

The at least one machine readable medium of example 32, the instructions may also cause the controller to map subsequent access requests from the requesting computing node to the one or more shared storage devices.

Example 34

The at least one machine readable medium of example 27, the plurality of storage devices may be arranged to operate according to one or more NVMe Base Specifications including the NVMe Base Specification, revision 1.3.

Example 35

The at least one machine readable medium of example 34, the controller may be arranged to operate according to the one or more NVMe Base Specifications including the NVMe Base Specification, revision 1.3 and according to one or more NVMeoF Specifications including the NVMeoF Specification, revision 1.0.

Example 36

The at least one machine readable medium of example 35, the access request included in the fabric packet may be arranged according to the one or more NVMeoF Specifications including the NVMeoF Specification, revision 1.0.

Example 37

The at least one machine readable medium of example 36, the networking fabric may be arranged to operate using Fibre Channel communication protocols, InfiniBand communication protocols, RoCE communication protocols, iWARP communication protocols or TCP communication protocols.

It is emphasized that the Abstract of the Disclosure is provided to comply with 37 C.F.R. Section 1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single example for the purpose of streamlining the disclosure. This method of disclosure is not to be interpreted as reflecting an intention that the claimed examples require more features than are expressly recited in each claim. Rather, as the following claims reflect, inventive subject matter lies in less than all features of a single disclosed example. Thus, the following claims are hereby incorporated into the Detailed Description, with each claim standing on its own as a separate example. In the appended claims, the terms "including" and "in which" are used as the plain-English equivalents of the respective terms "comprising" and "wherein," respectively. Moreover, the terms "first," " "second," "third," and so forth, are used merely as labels, and are not intended to impose numerical requirements on their objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:
1. A controller comprising:
   circuitry; and
   logic for execution by the circuitry to:
      receive an access request to read data from or write data to at least one storage device of a plurality of storage devices coupled with a target host computing node that hosts the controller, the access request included in a fabric packet routed from a requesting computing node through a networking fabric coupled with the target host computing node;

detect whether the access request has a sequential access pattern to storage device memory addresses at the at least one storage device or a random access pattern to storage device memory addresses at the at least one storage device;

obtain configuration information that includes a memory bandwidth demand for the requesting computing node;

characterize the access request as a sequential stream based, at least in part, on the detected access pattern;

direct the access request to a dedicated storage device from among the plurality of storage devices; and map access requests from the requesting computing node to the dedicated storage device based, at least in part, on the dedicated storage device having enough available memory bandwidth to fulfill the memory bandwidth demand.

2. The controller of claim 1, wherein the logic to characterize the access request as the sequential stream further comprises the logic to:

obtain configuration information that includes a time threshold for a period of time between when a previous access request was received from the requesting computing node and when the access request was received, the previous access request previously characterized as a random stream; and characterize the access request as the sequential stream based, at least in part, on the period of time exceeding the time threshold.

3. The controller of claim 1, comprising the configuration information to also include an identifier for the requesting computing node, the logic to:

use the identifier to map the access requests to the dedicated storage device;

receive a second access request from the requesting computing node that includes the identifier;

characterize the second access request as a sequential stream based on the identifier; and direct the second access request to the dedicated storage device based on the mapping of the access requests to the dedicated storage device.

4. The controller of claim 1, comprising the configuration information also includes an identifier for the requesting computing node, the logic to:

use the identifier to map access requests from the requesting computing node to the dedicated storage device;

receive a second access request included in a second fabric packet from the requesting computing node that includes the identifier and information indicating a change in access patterns from sequential to random access patterns for the second access request;

characterize the second access request as a random stream based, at least in part, on the identifier and the indication of the change in access patterns; and direct the second access request to one or more shared storage devices from among the plurality of storage devices.

5. The controller of claim 4, further comprising the logic to:

map subsequent access requests from the requesting computing node to the one or more shared storage devices.

6. The controller of claim 1, comprising the logic to detect whether the access request has a sequential or a random access pattern includes use of a field programmable gate array (FPGA) to detect the detected access pattern.

7. The controller of claim 1, comprising the plurality of storage devices arranged to operate according to one or more Non-Volatile Memory Express (NVMe) Base Specifications including the NVMe Base Specification, revision 1.3.

8. The controller of claim 7, comprising the controller arranged to operate according to the one or more NVMe Base Specifications including the NVMe Base Specification, revision 1.3 and according to one or more NVM Express over Fabrics (NVMeoF) Specifications including NVMeoF Specification, revision 1.0.

9. The controller of claim 8, comprising the access request included in the fabric packet is arranged according to the one or more NVMeoF Specifications including the NVMeoF Specification, revision 1.0.

10. The controller of claim 9, comprising the networking fabric arranged to operate using Fibre Channel communication protocols, InfiniBand communication protocols, Remote Direct Memory Access (RDMA) over Converged Ethernet (RoCE) communication protocols, Internet Wide Area RDMA Protocol (iWARP) communication protocols or transmission control protocol (TCP) communication protocols.

11. The controller of claim 1, comprising one or more of:
a command bus coupled to the circuitry;
one or more processors coupled to the command bus; and
a host fabric interface communicatively coupled to the circuitry.

12. A method comprising:

receiving, at a controller, an access request to read data from or write data to at least one storage device of a plurality of storage devices coupled with a target host computing node, the access request included in a fabric packet routed from a requesting computing node through a networking fabric coupled with the target host computing node;

detecting whether the access request has a sequential access pattern to storage device memory addresses at the at least one storage device or a random access pattern to storage device memory addresses at the at least one storage device;

obtain configuration information that includes a memory bandwidth demand for the requesting computing node;

characterizing the access request as a sequential stream based, at least in part, on the detected access pattern;

directing the access request to a dedicated storage device from among the plurality of storage devices; and mapping access requests from the requesting computing node to the dedicated storage device based, at least in part, on the dedicated storage device having enough available memory bandwidth to fulfill the memory bandwidth demand.

13. The method of claim 12, wherein characterizing the access request as the sequential stream further comprises:

obtaining configuration information that includes a time threshold for a period of time between when a previous access request was received from the requesting computing node and when the access request was received, the previous access request previously characterized as a random stream; and determining to characterize the access request as the sequential stream based, at least in part, on the period of time exceeding the time threshold.

14. The method of claim 12, comprising:
the configuration information also includes an identifier for the requesting computing node;
using the identifier to map the access requests to the dedicated storage device;
receiving a second access request from the requesting computing node that includes the identifier;

determining to characterize the second access request as a sequential stream based on the identifier; and directing the second access request to the dedicated storage device based on the mapping of the access requests to the dedicated storage device.

15. The method of claim 12, comprising:

the controller and the plurality of storage devices arranged to operate according to one or more Non-Volatile Memory Express (NVMe) Base Specifications including NVMe Base Specification, revision 1.3;

the controller also arranged to operate according to one or more NVM Express over Fabrics (NVMeoF) Specifications including NVMeoF Specification, revision 1.0;

the access request included in the fabric packet is arranged according to the one or more NVMeoF Specifications including the NVMeoF Specification, revision 1.0; and the networking fabric arranged to operate using Fibre Channel communication protocols, InfiniBand communication protocols, Remote Direct Memory Access (RDMA) over Converged Ethernet (RoCE) communication protocols, Internet Wide Area RDMA Protocol (iWARP) communication protocols or transmission control protocol (TCP) communication protocols.

16. At least one non-transitory machine readable medium comprising a plurality of instructions that in response to being executed by a controller cause the controller to:

receive an access request to read data from or write data to at least one storage device of a plurality of storage devices coupled with a target host computing node that hosts the controller, the access request included in a fabric packet routed from a requesting computing node through a networking fabric coupled with the target host computing node;

detect whether the access request has a sequential access pattern to storage device memory addresses at the at least one storage device or a random access pattern to storage device memory addresses at the at least one storage device;

obtain configuration information that includes a memory bandwidth demand for the requesting computing node;

characterize the access request as a sequential stream based, at least in part, on the detected access pattern;

direct the access request to a dedicated storage device from among the plurality of storage devices; and map access requests from the requesting computing node to the dedicated storage device based, at least in part, on the dedicated storage device having enough available memory bandwidth to fulfill the memory bandwidth demand.

17. The at least one non-transitory machine readable medium of claim 16, the instructions to cause the controller to characterize the access request as the sequential stream further comprises the instructions to cause the controller to:

obtain configuration information that includes a time threshold for a period of time between when a previous access request was received from the requesting computing node and when the access request was received, the previous access request previously characterized as a random stream; and characterize the access request as the sequential stream based, at least in part, on the period of time exceeding the time threshold.

18. The at least one non-transitory machine readable medium of claim 16, comprising the configuration information also includes an identifier for the requesting computing node, the instructions to further cause the controller to:

use the identifier to map access requests from the requesting computing node to the dedicated storage device;

receive a second access request included in a second fabric packet from the requesting computing node that includes the identifier and information indicating a change in access patterns from sequential to random access patterns for the second access request;

characterize the second access request as a random stream based, at least in part, on the identifier and the indication of the change in access patterns; and direct the second access request to one or more shared storage devices from among the plurality of storage devices.

19. The at least one non-transitory machine readable medium of claim 18, further comprising the instructions to cause the controller to:

map subsequent access requests from the requesting computing node to the one or more shared storage devices.

20. The at least one non-transitory machine readable medium of claim 16, comprising:

the controller and the plurality of storage devices arranged to operate according to one or more Non-Volatile Memory Express (NVMe) Base Specifications including NVMe Base Specification, revision 1.3;

the controller also arranged to operate according to one or more NVM Express over Fabrics (NVMeoF) Specifications including NVMeoF Specification, revision 1.0;

the access request included in the fabric packet is arranged according to the one or more NVMeoF Specifications including the NVMeoF Specification, revision 1.0; and the networking fabric arranged to operate using Fibre Channel communication protocols, InfiniBand communication protocols, Remote Direct Memory Access (RDMA) over Converged Ethernet (RoCE) communication protocols, Internet Wide Area RDMA Protocol (iWARP) communication protocols or transmission control protocol (TCP) communication protocols.

* * * * *